219-121
7/6/82  OR  4,338,508

United States Patent [19]

Jones et al.

[11] 4,338,508
[45] Jul. 6, 1982

[54] INSCRIBING APPARATUS AND METHODS

[76] Inventors: Geraint A. C. Jones, 54, Kelsey Crescent, Cherry Hinton, Cambridge; Haroon Ahmed, 9, Owlstone Rd., Cambridge, both of England

[21] Appl. No.: 212,246

[22] Filed: Dec. 2, 1980

Related U.S. Application Data

[63] Continuation-in-part of Ser. No. 80,034, Sep. 28, 1979, abandoned.

[30] Foreign Application Priority Data

Oct. 2, 1978 [GB] United Kingdom ............... 38953/78

[51] Int. Cl.³ .......................... G21K 5/10; B23K 26/02
[52] U.S. Cl. .................. 219/121 EJ; 219/121 LH; 219/121 LJ; 219/121 LB; 219/121 LX; 219/121 LY; 219/121 EK; 219/121 EW; 219/121 EY; 219/121 LS; 219/121 EA; 250/492.2; 356/401
[58] Field of Search .................. 219/121 EA, 121 EB, 219/121 EM, 121 EU, 121 L, 121 LA, 121 LB, 121 LM, 121 LS, 121 LT, 121 LU, 121 EJ, 121 EK, 121 EW, 121 EX, 121 EY, 121 LH, 121 LJ, 121 LX, 121 LY; 250/441, 491, 492.2; 356/400, 401

[56] References Cited

U.S. PATENT DOCUMENTS

| | | | |
|---|---|---|---|
| 3,588,347 | 6/1971 | Montone et al. | 250/492 A X |
| 3,588,463 | 6/1971 | Best | 219/121 EY X |
| 3,651,303 | 3/1972 | Rehme et al. | 219/121 EW |
| 3,663,793 | 5/1972 | Petro et al. | 219/121 LJ |
| 3,739,088 | 6/1973 | Landsman | 219/121 LW X |
| 3,752,589 | 8/1973 | Kobayashi | 356/401 |
| 3,842,236 | 10/1974 | VonWalter | 219/121 EY |
| 3,864,597 | 2/1975 | Trotel | 219/121 EW X |
| 3,925,785 | 12/1975 | Firtion et al. | 219/121 LX X |
| 4,046,986 | 9/1977 | Barker | 219/121 L X |
| 4,171,162 | 10/1979 | Gerard et al. | 356/400 X |

*Primary Examiner*—J. V. Truhe
*Assistant Examiner*—Keith E. George
*Attorney, Agent, or Firm*—Oblon, Fisher, Spivak, McClelland & Maier

[57] ABSTRACT

Apparatus and methods for inscribing workpieces for the fabrication of masks and direct fabrication of microcircuits are described. The invention is primarily concerned with correcting for positional errors and to this end two coaxial beams (20,32) are directed towards a worktable from opposite sides thereof, the beam (20) serving as the scribing beam and the beam (32), operating in a reading mode, serving to read positional information and generate appropriate error signals for correcting the point of impact of the beam (20) with the surface of the substrate to be inscribed (28,46). In one embodiment the table (10) is solid and two layers of substrate are used on opposite surfaces of the table (10). The lower substrate (30) constitutes a master substrate which can be left in position while a large number of virgin substrates are exposed on the upper surface of the table (10). In another embodiment the table (44) is in the form of a frame for peripherally supporting a wafer on substrate workpiece (46) so that both upper and lower surfaces of the wafer are exposed to the two electron beams, the underside surface constituting the registration surface. Marks are formed therein by scribing the surface using the beam (32).

17 Claims, 3 Drawing Figures

INSCRIBING APPARATUS AND METHODS

CROSS-REFERENCE

This application is a continuation-in-part of our application Ser. No. 080,034 filed Sept. 25, 1979 and now abandoned.

FIELD OF INVENTION

This invention relates to apparatus and methods for inscribing accurately on workpieces. It has particular application in the manufacture of masks for use in the manufacture of microcircuits and devices and in the direct manufacture of microcircuits and devices on substrates or wafers.

BACKGROUND TO THE INVENTION

A workpiece in the context of this application may comprise a mask on which a circuit pattern is to be inscribed or may be a wafer or a substrate of the actual material on which the microcircuit or device is to be formed. Since the devices and microcircuits under consideration are typically very small in size, such workpieces must be positioned very accurately and must be capable of being moved extremely precisely.

To assist in this a workpiece or a worktable on which the workpiece is mounted has been provided with a set of registration marks which are used inter alia for alignment of the system. However the presence of registration marks on the surface of a workpiece on which a device or microcircuit is to be inscribed restricts the area on that surface which can be used for this purpose. To this end circuit designers are forced to design the circuits so as to avoid the places where the marks are to be positioned.

It is thus an object of the present invention to provide an apparatus for inscribing and a method of alignment of such apparatus which allow more freedom to the circuit designer and allow greater positional accuracy to be obtained in use.

THE INVENTION

According to the present invention inscribing apparatus comprises a worktable for supporting a workpiece means, which has opposed parallel workpiece faces exposed to opposite directions, means for generating a first beam, means for directing the first beam on to a first of said workpiece faces, for the controlled inscribing thereof, means for generating a second beam, means for directing the second beam on an axis effectively coaxial with the axis of the first beam but in the opposite direction on to the opposed workpiece face, for the detection of position control marks on said opposed face, means for deriving electrical position control signals responsive to detection of the position control marks, and means for controlling the relative positions of the first beam and the first of the workpiece faces to produce inscribing of said first face positionally controlled dependent on the position control marks on the opposed face.

The said controlling means may include means for controlling the position of the first beam, together with means for controlling the position of the worktable. Thus, in a preferred embodiment, said position control signals deriving means comprises comparator means for producing positional error information signals, means for detecting the magnitude of said error signals, and means for supplying coarse adjustment error signals to the worktable position controlling means and fine adjustment error signals to the first beam position controlling means.

Said workpiece means may comprise a first workpiece carrying the first workpiece face and a second workpiece carrying the opposed workpiece face bearing the position control marks. Alternatively the table may be in the form of a frame so that both sides of a single workpiece carried therein are exposed.

In the event that the first and second beams are not strictly coaxial, reference marks are provided to enable a pre-alignment step. The reference marks may be on the underside of the table or on the second workpiece or on the opposite surface of a single workpiece. Thus, according to one possibility, means are provided for deriving pre-alignment correction signals responsive to detection of the reference marks by the two beams, and means are provided for adjusting the relative starting position of the worktable/workpiece means assembly and at least one of the two beams in accordance with said pre-alignment correction signals. Alternatively and preferably, in order to render the first and second beams effectively coaxial, reference marks are provided on the worktable/workpiece means assembly, means are provided for deriving and storing offset correction signals responsive to detection of the reference marks by the two beams, and means are provided to read the stored offset correction signals to modify the action of the controlling means when the relative positions of the first beam and the first workpiece face are being controlled during inscribing.

The beams may comprise light beams or electron beams or ion beams. Typically both beams are capable of inscribing onto a workpiece surface. The second beam may be used for the initial writing of registration marks onto a workpiece surface and thereafter for reading those marks and providing the positional information signals.

According to the present invention a method of inscribing one surface of a workpiece mounted on a worktable, comprises the steps of:

supporting a workpiece means on a worktable with two parallel workpiece faces exposed to opposite directions, generating a first beam, directing the first beam towards a first of said workpiece faces, generating a second beam, directing the second beam on an axis effectively coaxial with that of the first beam but in the opposite direction on to the opposed workpiece face, providing position control marks on said opposed face, deriving position control signals responsive to detection of the position control marks by the second beam, controlling the relative positions of the first beam and the first said workpiece face to produce inscribing of said first face dependent on the position control marks on the opposed face.

The positional information may be obtained by using position control marks on a second workpiece carried on the said opposite side of the worktable or on the opposite surface of one workpiece.

The position of the point of impact may be controlled in a pre-alignment step by adjusting the position of the table or the first beam or both, dependent on detection of reference marks on the table.

The invention also lies in the method of inscribing a workpiece surface which includes the additional steps of providing pre-alignment reference marks on the worktable/workpiece means assembly, reading said reference marks to provide offset correction signals, and utilising said offset correction signals to modify the position control signals during inscribing.

The invention will now be described by way of example with reference to the accompanying drawing.

IN THE DRAWING

DETAILED DESCRIPTION OF DRAWING

It will be evident that the invention is only of application to a system in which the two beams are accurately aligned or if not so aligned, any offset or difference in alignment is known in advance and can be compensated for. The systems shown in FIGS. 1 and 2 will be assumed to have perfectly aligned beams; the method of pre-alignment of non-aligned beams will be described later.

Figure 1:
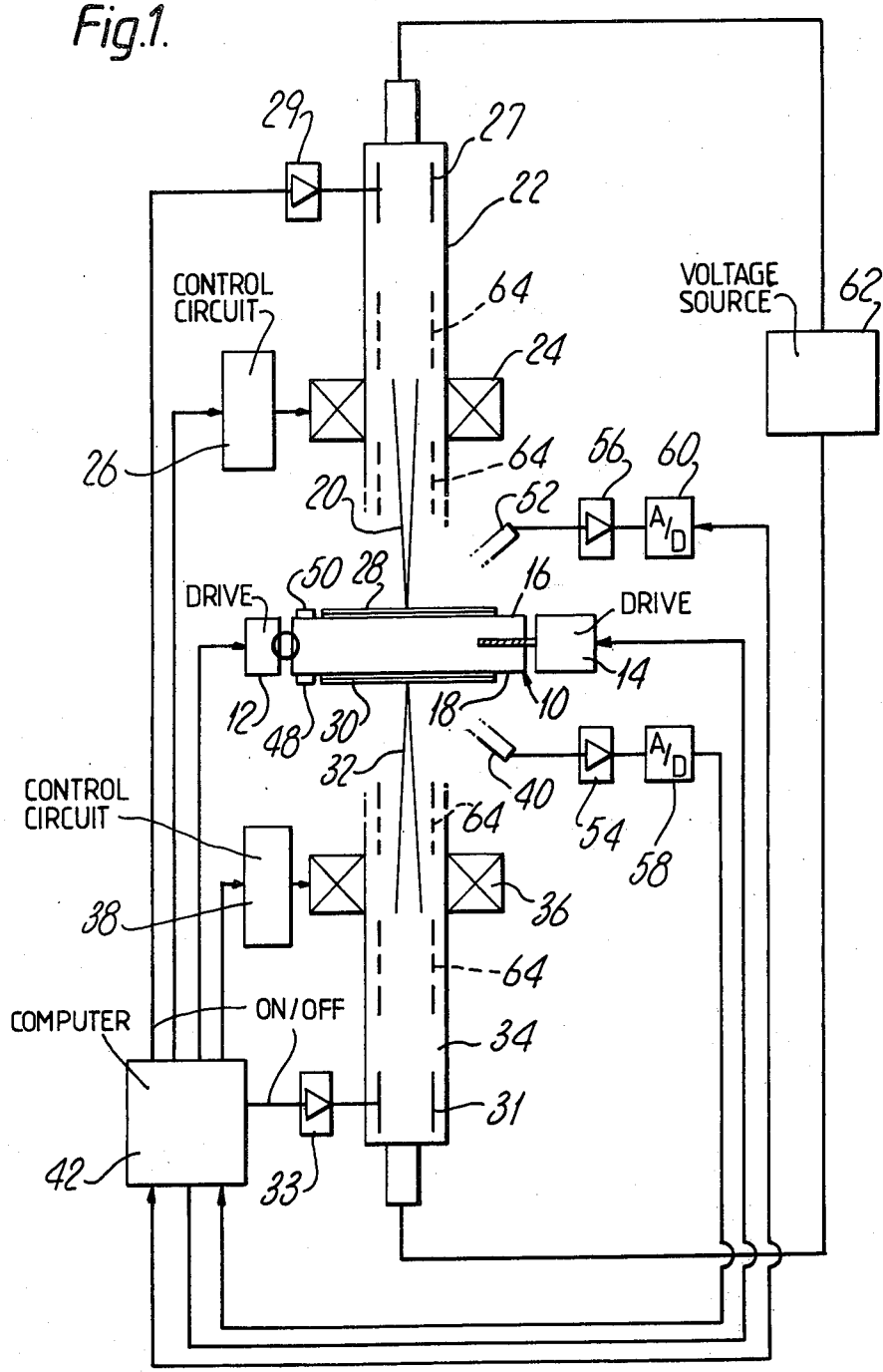
FIG. 1 is a diagrammatic view of apparatus embodying the invention.

Referring to FIG. 1, a worktable 10 is provided with means 12 and 14 for moving the table in two orthogonal directions parallel to the plane of the table. The table 10 is accessible from its two opposite sides namely the top surface 16 and the opposing underside 18.

Directed towards surface 16 is a writing or inscribing beam 20 from an electron column 22 forming a beam generating means. Deflection coils 24 are provided for moving the beam 20 and drive for the deflection coils is obtained from a control circuit 26. Deflection plates 27 allow the beams 20 to be blanked when required. Control signals for the plates 20 are obtained from a driver circuit 29.

A workpiece 28 is mounted on the upper surface 16.

A second workpiece 30 is mounted on the underside 18 and is used as the registration surface.

A second beam 32 from a second electron column 34 constituting a beam generating means is directed towards the underside 18 of the table 10. The column 34 includes a set of deflection coils 36 control signals for which are obtained from a further control circuit 38. Blanking of beam 32 is achieved using deflection plates 31 and associated driver circuit 33.

A sensor 40 associated with the second beam 32 generates electrical signals which in combination with position information from the control circuit 38 is processed by a signal processing stage 42 which is conveniently a small computer and which produces inter alia positional error information signals from the input information. If the errors are only small as will normally be the case, these signals are supplied from the computer to the control circuit 26 so as to allow a correction to be made to the position of the beam 20. If because of mechanical engineering imperfections or wear (factors not normally present in precision equipment of this type) the errors may be larger and in that event the position of the table 10 may be adjusted by feeding an error signal to the drive 12 and/or drive 14, as an initial correction and thereafter the position of the beam 20 may be adjusted by supplying a fine correction signal to the control circuit 26. The computer 42 is programmed so as to determine whether or not a control signal is first to be supplied to the drive 12 or whether the correction required is small enough to be accommodated by a deflection correction applied to circuit 26.

The position of the table 10 and/or beam 20 is thus adjusted in dependence on the positions of position control registration marks on the workpiece which are located by the beam 32 when operating in its reading mode.

The second beam 32 has two modes of operation. In the first mode it can be used to inscribe the registration surface with registration marks. In its second mode of operation it serves as a reading means as previously described.

Although sensor 40 has been shown separate from the electron column it is to be understood that any suitable method of generating the information during the reading mode may be used such as by deriving signals from the specimen current variations during scanning.

Figure 2:
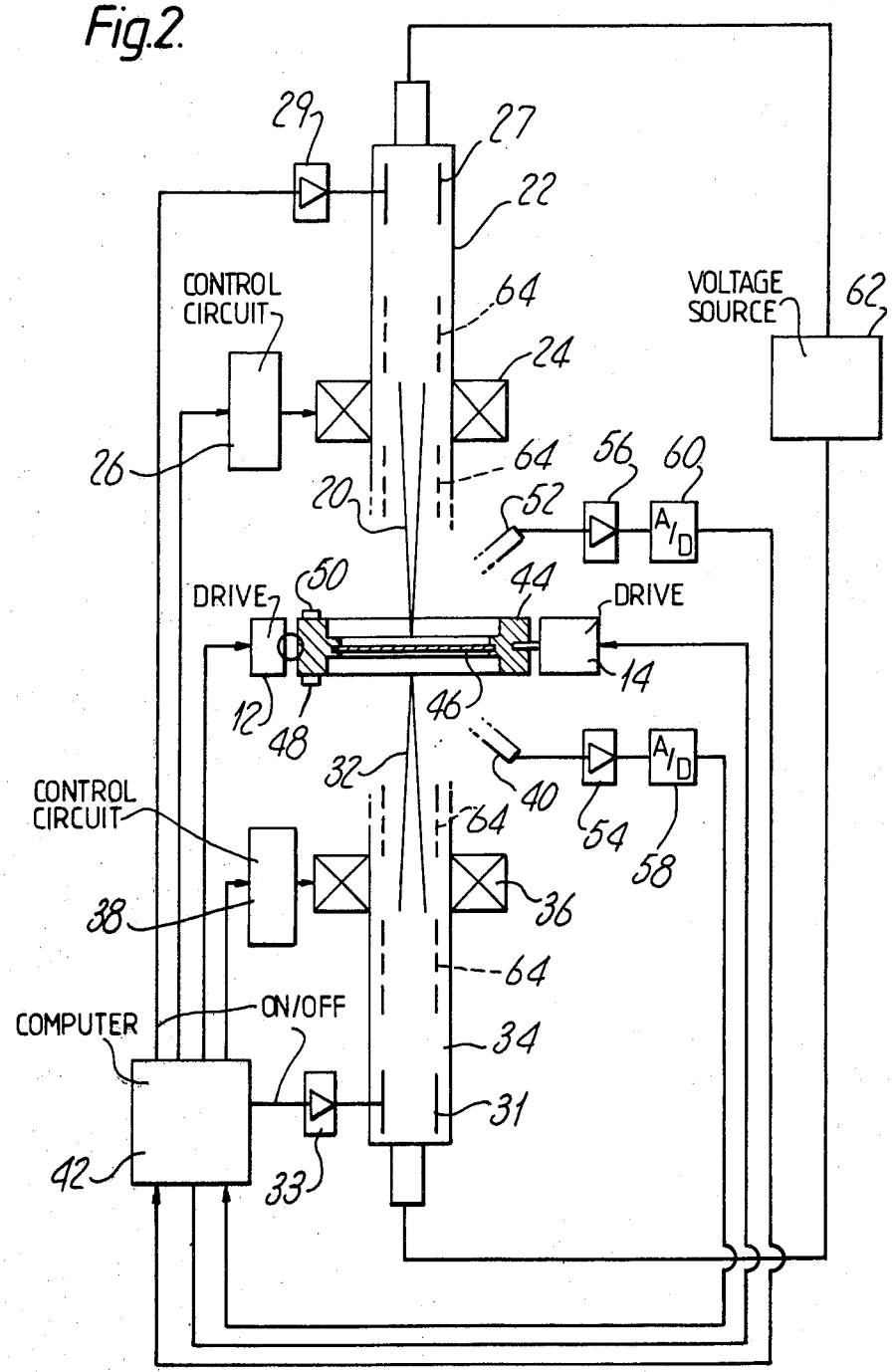
FIG. 2 is a diagrammatic view of another embodiment of the invention.

Referring now to FIG. 2, the same reference numerals have been used therein to denote similar components and the functions of these components where the same reference numeral has been used are identical to the function of the corresponding components in the apparatus of FIG. 1.

The primary difference between FIG. 2 and FIG. 1 is the worktable. In FIG. 2, a frame 44 is used in place of the solid worktable 10 thus allowing a single wafer or substrate 46 to be supported with both its upper and lower surface exposed. The beam 20 is directed towards the upper surface of the workpiece 46 whilst the lower beam 32 is directed towards the lower surface. Since both surfaces are available, points of impact arise on both surfaces and by providing marks on the lower surface impinged on by the beam 32, so the system can operate in exactly the same way as has been described with reference to FIG. 1. The advantage lies in the fact that the registration marks are provided on the underside of the actual workpiece so that any distortion or other changes occurring during manufacture of the microcircuit or device automatically produces a distortion in the positions of the registration marks on the underside of the workpiece 46 and accurate positioning of the upper surface of the workpiece for inscribing by the beam 20 during subsequent processing can thus be obtained at all stages during the process of manufacture.

In the FIG. 2 embodiment the underside of the actual workpiece thus constitutes the registration surface previously provided by the second workpiece 30 located on the underside 18 of the table 10.

It is to be understood that the marks which are to be read by the beam 32 in its reading mode may be inscribed either inside or outside the apparatus by using other means such as mechanical scribing or exposure of marks using light optical instruments.

In a modification described hereinafter, the underside of the table 10 is scribed or otherwise provided with alignment or reference marks which can be read during a pre-alignment step by the beam 32 in its reading mode. It is possible, in the FIG. 2 embodiment, for the reference marks also to be carried by the material being processed.

The great advantage of the invention is that the registration or position control marks do not interfere with the surface which is to be scribed by the inscribing beam 20 and therefore the whole area of the wafer or substrate forming the workpiece can be utilised.

In use the registration surface (whether it be the underside of a second workpiece as in FIG. 1, or the underside of the actual workpiece as in FIG. 2) is formed with a series or matrix of marks which most conveniently are written thereon by means of beam 32. The marks are processed so that they can subsequently be read by the beam 32 operating in a reading mode. This processing may be by etching or other suitable processing.

With the registration surface in position and the beam 32 operating in a reading mode, the table is moved until a first set of registration marks are found by beam 32. An error signal is generated by circuit 42 which indicates the amount by which the table 10 and/or beam 20 must be moved via devices 12, 14 and 26 and an appropriate shift is provided. The writing sequence using beam 20 can then be initiated and is continued until a unit area of the hitherto unwritten substrate of workpiece 28 has been written upon by the writing beam 20. Once the writingup of this area has been completed, worktable 10 moves again until a second mark is found by the reading beam 32. Again fine positioning of the beam 20 and table 10 is carried out as required and a further area of the unexposed substrate 28 is written-up until the whole of the surface of the substrate (workpiece) 28 has been written-up. Each area of the substrate so written-up has an accurate reference to the registration surface read by the reading beam 32.

The written-up substrate 28 can now be replaced by a fresh unexposed substrate and the process repeated to cover the new substrate with the pattern or circuit required thereon as defined by the matrix on the registration surface or master substrate 30. It will be seen that the process can be carried out ad infinitum so as to create a set of substrates with either identical or differing patterns. A set of substrates is produced thereby with the pattern elements of each one accurately positioned relative to those on the other substrates in the set but without any of the marks appearing on the surfaces of the substrates which have been written-up.

In the FIG. 2 embodiment, a similar process is carried out except that in the first step prior to the scribing mode of operation, the underside of the substrate 46 is marked by the beam 32 operating in its writing mode. When operating in a subsequent reading mode, the beam 32 and associated circuits provided the positional information and error correction signals for correcting the position of the beam 20 and/or the worktable 44.

If one member of the set of exposed substrates has to be replaced at any time after the set has been produced, a new member may be exposed or written-up using the master substrate 30. Any new substrate so produced will fit into the set thus obviating the need to produce a new set every time any one of its members has to be changed.

The FIG. 2 embodiment is used when a series of patterns are to be overlaid accurately upon the same substrate. Here the reverse side of the substrate is used in place of the master substrate 30 since the underside of the substrate is now accessible to the beam 32. In this way distortions appearing in the substrate as a result of processing between the first and second exposures can be detected and appropriate corrections made via the circuits 42 and 26 so that errors arising from such distortions can be eliminated.

The invention may be directly applied to the manufacture of electron beam fabricated masks for the production of solid state and semiconductor devices or used in direct fabrication of semiconductor devices onto a silicon wafer and the like. In the latter case both the writing and reading/writing beams are finely focused electron beams. The reading beam operates in the same manner as in the scanning electron microscope and can have resolving power of better than 100AU. Thus it is able to locate the markers on a master substrate to near this degree of accuracy.

In alternative embodiments not shown in the drawing, the beams may be light beams or ion beams.

Although the apparatus can be constructed so that the axes of the two columns are coaxial, it is well known that this will not necessarily result in true axial alignment of the two electron beams to the accuracy required in the applications envisaged herein. The two beams may therefore have to be pre-aligned using reference signals (in a manner to be described) which are generated by reference marks which reflect electrons. Typically these marks are provied on the underside of the table 10 or, where upper and lower faces of the workpiece are exposed to the two beams respectively, the reference marks may be provided on the underside of the latter. Where there is space within a frame type table such as shown in FIG. 2, an auxiliary workpiece member may be located within the frame which is perforated to render it partly transparent to electrons, to form a scanning transmission electron picture when in the field of view of one or other of the beams.

Information is derived from a scanning of the reference marks on the table or workpiece or auxiliary workpiece and the information may be used for the purpose of accurately aligning the points of impact of the two beams. Alternatively and preferably the information so derived may be used for generating (typically within an associated computer) displacement information which will allow any offset between the two points of impact to be determined and taken into account in subsequent scanning operations.

The term pre-alignment is thus intended to include either a corrective measure securing perfect coaxial alignment of the two beams or a correction to be stored in a memory and subsequently used for the purpose of updating and correcting the deflection signals applied to the scribing beam during subsequent scanning.

This latter alternative is the more normal one and during a pre-alignment step of this type, any lateral displacement between the axis of one beam and the axis of the other beam is detected and stored in the computer memory.

A typical pre-alignment step involves turning off beam 20, moving the table 10 until alignment or reference marks 48 on the underside of the table are in the field of view of beam 32. The latter is then scanned within the field of view to locate the marks 48 and alignment information relating to the position, rotation, scale and orthogonality of the marks 48 is determined from the signals from detector 40. This first alignment information is stored in the memory of computer 42.

A second stage of the pre-alignment step involves turning off beam 32, turning on beam 20 and following the same procedure for a second set of alignment or reference marks 50 located on the other face of the table 10. The table is kept quite stationary during the first and second stages of the pre-alignment step. The reference marks 48 and 50 are as far as possible aligned with one another across the thickness of the table so that if the table is positioned so that the marks 48 are in the field of view of the beam 32, the mark 50 will be in the field of view of the beam 20 assuming that the two beams are completely coaxially aligned.

A second detector 52 is provided for obtaining signals from which position rotation scale and orthogonality of the marks 50 can be obtained. These signals are again stored in the computer memory.

Since the signals from the detectors 40 and 52 will in general be in analogue form, analogue amplifiers 54 and 56 are conveniently provided feeding analogue to digital converters 58 and 60 respectively so that the information from the detectors 40 and 52 is in an appropriate form for feeding to a digital computer such as would normally be used.

In practice a single pre-amplifier and single analogue to digital converter circuit may be employed and the inputs from the two detectors 40 and 52 may be selectively supplied to the input of the one amplifier and, where it is ensured that only one beam will be used at any one time, the selective switching can be dispensed with since clearly signals will only be obtained from a detector 40 or 52 if the appropriate beam is on.

The two alignment informations obtained and stored in the computer memory are compared within the computer and any differences noted and stored in the computer memory. For convenience the alignment information relating to the beam 32 is taken as a reference and any differences which are computed are expressed as corrections or offsets to be applied to the control signals employed in scanning the other beam 20.

It is to be noted that the corrections or offsets could be obtained equally by using alignment information from the other beam 20 as the reference.

Once these corrections or offsets are in the computer memory, the system is ready to be used and, as previously described, the table 10 is then moved so as to present the appropriate workpiece area to the beam 32 for scanning. When the beam 32 is scanning marks already present in the workpiece, positional error information signals relating to the pattern of marks being scanned are fed to the computer 42 and control signals are generated for the control circuit 26 for the beam 38 (after any table position correction has been completed) using (a) the positional error information arising from the scanning of the marks on the workpiece by the beam 32, and (b) the corrections an offset obtained by the prealignment step and already stored in the computer memory.

The best mode of operation for keeping the beams coincident is dependent on actual requirements and it is recommended that the accelerating voltage for the two beams 20, 32 is derived from the same source 62 so that any errors due to chromatic effects are made equal in the two columns.

Similarly the control circuits 26 and 38 can be made one and the same, with the deflection coils 24 and 36 being connected in series. By this means any amplifier drift equally affects both beams reducing the error to a common mode error.

However, the series connection of two coils limits the speed of operation. To achieve higher speeds it is necessary to use, as shown, separate high quality low drift amplifiers 26 and 38 driving separate coils.

External influences such as magnetic fields may be shielded in the normal manner used in electron microscopes as by mu-metal shields 64 shown in dotted outline only in the drawings.

Figure 3:
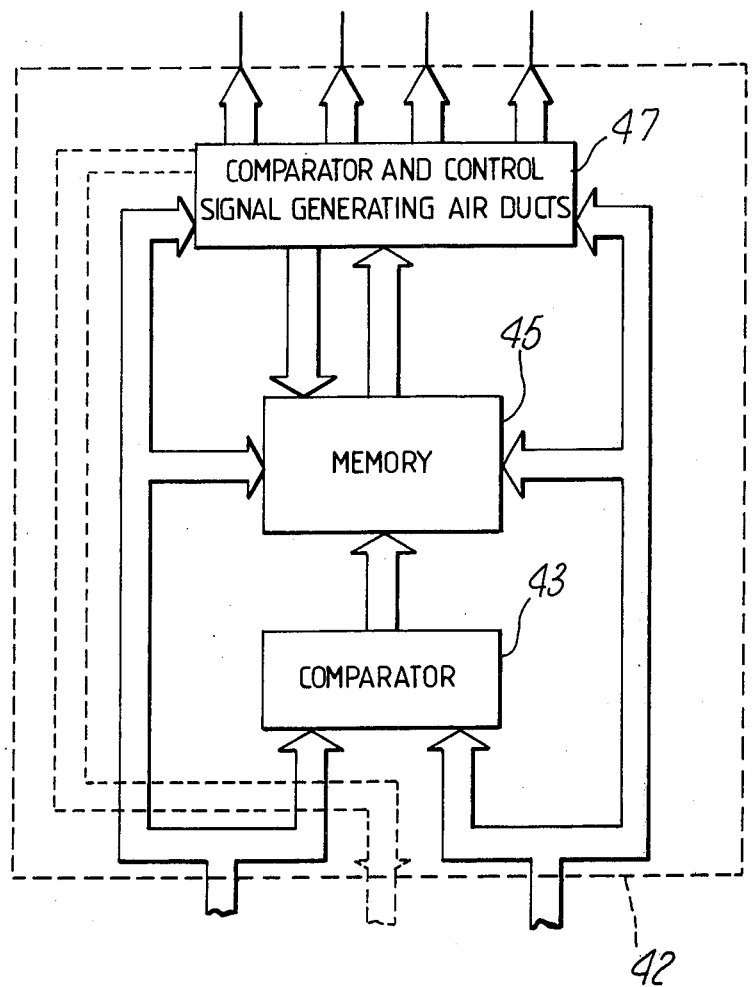
FIG. 3 is a diagrammatic view of the computer shown in FIGS. 1 and 2.

FIG. 3 illustrates the important constituent parts of the computer 42, previously referred to in the text. In particular, the figure shows a comparator 43 which determines the magnitude and nature of any positional inaccuracies from information received during prealignment, a memory 45 for storing information relating to any such positional inaccuracies and a comparator and control signal generating circuit 47 which computes control signals for one of the beams and the stage in response to the signal stored in the memory 45 and signals from the reading beam 32.

What is claimed is:

1. Apparatus for scribing a workpiece surface comprising:
    a worktable for supporting a workpiece means, which has opposed parallel workpiece faces exposed to opposite directions;
    means for generating a first beam;
    means for directing the first beam towards the worktable for the controlled inscribing of a first of said workpiece faces;
    means for generating a second beam;
    means for directing the second beam on an axis effectively co-axial with the axis of the first beam but in the opposite direction towards the opposed worktable face;
    position indicating means carried on the worktable;
    means for deriving electrical position signals from impingement of the two beams with the indicator means;
    comparator means for determining any offset between the axes of the two beams;
    memory means for storing information relating to said offset;
    means for moving a workpiece into position so that the two beams impinge on opposite faces thereof, and so that the second beam can detect position control marks on the opposed face of the workpiece; and
    means for controlling the relative positions of the first beam and the first of the workpiece faces to produce inscribing of said first face positionally controlled dependent on the position control marks on the opposed face and dependent on the stored information relating to the offset.

2. Apparatus according to claim 1, wherein the said controlling means includes means for controlling the position of the first beam.

3. Apparatus according to claim 2, wherein the said controlling means includes means for controlling the position of the worktable.

4. Apparatus according to claim 3, wherein said position control signals deriving means comprises comparator means for producing positional error information signals, means for detecting the magnitude of said error signals, and means for supplying coarse adjustment error signals to the worktable position controlling means and fine adjustment error signals to the first beam position controlling means.

5. Apparatus according to claim 1, wherein said workpiece means comprises a first workpiece carrying the first workpiece face and a second workpiece carrying the opposed workpiece face bearing the position control marks.

6. Apparatus according to claim 1, wherein said worktable is in the form of a frame and a single workpiece is supported within the frame and the first beam is directed towards one face of the workpiece and the second beam is directed towards the opposite face of the workpiece for reading marks formed thereon to provide the said position control signals.

7. Apparatus according to claim 1, wherein the means for generating the first beam is an ion source for producing an ion beam.

8. Apparatus according to claim 7, wherein the means for directing the ion beam is electrostatic.

9. Apparatus according to claim 1, wherein the means for generating the second beam is an electron column.

10. Apparatus according to claim 1, wherein the means for generating the second beam is an ion source.

11. Apparatus according to claim 1, wherein the axes of the first and second beams are precisely coaxial in space.

12. Apparatus according to claim 11, wherein, in order to render the first and second beams precisely coaxial in space, reference marks are provided on the worktable/workpiece means assembly, means are provided for deriving pre-alignment correction signals responsive to detection of the reference marks by the two beams, and means are provided for adjusting the relative starting position of the worktable/workpiece means assembly and at least one of the two beams in accordance with said pre-alignment correction signals.

13. Apparatus according to claim 1, wherein, in order to render the first and second beams effectively coaxial, reference marks are provided on the worktable/workpiece means assembly, means are provided for deriving and storing offset correction signals responsive to detection of the reference marks by the two beams, and means are provided to read the stored offset correction signals to modify the action of the controlling means when the relative positions of the first beam and the first workpiece face are being controlled during inscribing.

14. Apparatus according to claim 13, wherein the stored offset correction signals are applied to modify the electrical position control signals.

15. A method of scribing a workpiece surface comprising the steps of:
supporting a workpiece means on a worktable with two parallel workpiece faces exposed to opposite directions;
generating a first beam;
directing the first beam towards the first of said workpiece faces to allow for controlled inscribing thereof;
generating a second beam;
directing the second beam on an axis effectively coaxial with that of the first beam but in the opposite direction onto the opposed workpiece face;
providing position control marks on the worktable;
deriving electrical position signals from impingement of the two beams with the indicator means;
determining any offset between the axes of the two beams by comparing the electrical position signals relating to the two beams;
storing information relating to any said offset in memory means;
moving a workpiece into position so that the two beams impinge on opposite faces thereof and detecting position control marks on the opposed face of the workpiece by the second beam; and
controlling the relative positions of the first beam and the first of the workpiece faces to produce positionally controlled inscribing of said first face dependent on the position control marks on the opposed face and dependent on the stored information relating to any offset in the axes of the beams.

16. A method according to claim 15, including the additional step of physically pre-aligning the first and second beams in precise coaxial relationship prior to inscribing.

17. A method according to claim 15, including the additional steps of providing pre-alignment reference marks on the worktable/workpiece means assembly, reading said reference marks to provide offset correction signals, and utilising said offset correction signals to modify the position control signals during inscribing.

* * * * *